(12) United States Patent
Kim et al.

(10) Patent No.: US 11,249,358 B2
(45) Date of Patent: Feb. 15, 2022

(54) DISPLAY DEVICE

(71) Applicant: Samsung Display Co., Ltd., Yongin-Si (KR)

(72) Inventors: Dong Lim Kim, Suwon-si (KR); Je Hyeong Park, Seoul (KR); Kyoung-Jun Kim, Hwaseong-si (KR); Yu-Jin Kim, Asan-si (KR); Chang Young Kim, Asan-si (KR); Ji Hyun Min, Bucheon-si (KR); Min Hee Son, Anyang-si (KR); Hyoung Wook Song, Cheonan-si (KR); Chan Young Lim, Cheonan-si (KR)

(73) Assignee: Samsung Display Co., Ltd.

( * ) Notice: Subject to any disclaimer, the term of this patent is extended or adjusted under 35 U.S.C. 154(b) by 108 days.

(21) Appl. No.: 16/785,660

(22) Filed: Feb. 10, 2020

(65) Prior Publication Data
US 2021/0026210 A1    Jan. 28, 2021

(30) Foreign Application Priority Data

Jul. 23, 2019  (KR) .......................... 10-2019-0089160

(51) Int. Cl.
*G02F 1/1362*  (2006.01)
*G02F 1/1335*  (2006.01)
(Continued)

(52) U.S. Cl.
CPC ...... *G02F 1/136227* (2013.01); *G02F 1/1368* (2013.01); *G02F 1/133512* (2013.01);
(Continued)

(58) Field of Classification Search
CPC ......... G02F 1/133512; G02F 1/136209; G02F 1/136222
See application file for complete search history.

(56) References Cited

U.S. PATENT DOCUMENTS

2011/0122357 A1* 5/2011 Chang ................ G02F 1/13394
                                                         349/155
2014/0160395 A1* 6/2014 Park .................. G02F 1/133526
                                                         349/61
(Continued)

FOREIGN PATENT DOCUMENTS

KR  10-2016-0083177 A   7/2016
KR  10-2017-0126552 A   11/2017
(Continued)

OTHER PUBLICATIONS

Kim et al., KR20170126552A English translation (Year: 2017).*

*Primary Examiner* — Michael H Caley
*Assistant Examiner* — Jonathan Y Jung
(74) *Attorney, Agent, or Firm* — Innovation Counsel LLP

(57) ABSTRACT

A display device according to an embodiment includes: a substrate; and a plurality of pixels, the plurality of pixels including a first pixel, a second pixel and a third pixel. Each of the plurality of pixels including a gate line extends in a first direction; a first transistor and a second transistor connected with the gate line; a pixel electrode that includes a first subpixel electrode and a second subpixel electrode; a first bridge that connects the first subpixel electrode and the first transistor; and a second bridge that connects the second subpixel electrode and the second transistor. At least one of the second pixel and the third pixel includes a light blocking pattern that overlaps at least one of the first transistor and the second transistor. The first bridge and the second bridge do not overlap or cross the light blocking pattern in a plan view.

15 Claims, 10 Drawing Sheets

(51) Int. Cl.
   *G02F 1/1368* (2006.01)
   *H01L 27/12* (2006.01)

(52) U.S. Cl.
   CPC .. *G02F 1/133514* (2013.01); *G02F 1/136286* (2013.01); *H01L 27/124* (2013.01); *H01L 27/1248* (2013.01); *G02F 1/136222* (2021.01)

(56) References Cited

U.S. PATENT DOCUMENTS

| | | | |
|---|---|---|---|
| 2014/0285754 A1* | 9/2014 | Lee | G02F 1/133788 349/106 |
| 2015/0116625 A1* | 4/2015 | Hwang | G02F 1/133753 349/57 |
| 2016/0195789 A1* | 7/2016 | Park | G02F 1/133514 349/43 |
| 2016/0306220 A1* | 10/2016 | Zhang | G02F 1/133345 |
| 2018/0275471 A1* | 9/2018 | Park | G02F 1/1368 |

FOREIGN PATENT DOCUMENTS

| | | | |
|---|---|---|---|
| KR | 20170126552 A | * | 11/2017 |
| KR | 10-2018-0107442 A | | 10/2018 |
| KR | 10-2018-0133979 A | | 12/2018 |
| KR | 10-2019-0005277 A | | 1/2019 |

\* cited by examiner

DISPLAY DEVICE

CROSS-REFERENCE TO RELATED APPLICATION

This application claims priority to and the benefit of Korean Patent Application No. 10-2019-0089160 filed in the Korean Intellectual Property Office on Jul. 23, 2019, the entire contents of which are incorporated herein by reference.

BACKGROUND

(a) Technical Field

This disclosure relates to a display device.

(b) Description of the Related Art

As a display device, a liquid crystal display (LCD), a light emitting display device, and the like have been used. The display device includes pixels that display an image, and each pixel includes a pixel electrode that receives a data voltage for representing predetermined luminance.

The pixel electrode may be electrically connected to a data line that transmits a data voltage through a switching element such as a transistor. The pixel electrode may be directly connected to the transistor through an opening formed in an insulating layer disposed between the pixel electrode and the transistor, and may be connected to the transistor through an extension portion of the pixel electrode or through a conductor that is electrically connected between the pixel electrode and the transistor through the opening. The pixel electrode may receive the data voltage transmitted by the data line through the transistor at predetermined timing.

The above information disclosed in this Background section is only for enhancement of understanding of the background and therefore it may contain information that does not form the prior art that is already known in this country to a person of ordinary skill in the art.

SUMMARY

Embodiments provide a display device having improved reliability.

More particularly, the embodiments provide a display device that can prevent physical and electrical characteristics of the transistor from changing by blocking light that can be incident on a transistor, and prevent a failure such as disconnection between a pixel electrode and a transistor.

A display device according to an embodiment includes: a substrate and a plurality of pixels, the plurality of pixels including a first pixel having a first color filter, a second pixel having a second color filter and a third pixel having a third color filter, each of the plurality of pixels including: a gate line that is disposed on the substrate, and extends in a first direction; a first transistor and a second transistor that are connected with the gate line; a pixel electrode that includes a first subpixel electrode and a second subpixel electrode that are separated from each other; a first bridge that connects the first subpixel electrode and the first transistor; and a second bridge that connects the second subpixel electrode and the second transistor. At least one of the second pixel and the third pixel includes a light blocking pattern that overlaps at least one of the first transistor and the second transistor. The first bridge and the second bridge do not overlap the light blocking pattern in a plan view.

Each of the first subpixel electrode and the second subpixel electrode may be substantially quadrilateral.

The first bridge may include a first extension portion protruding from the first subpixel electrode and a first contact portion having a wider width than the first extension portion, and the second bridge may include a second extension portion protruding from the second subpixel electrode and a second contact portion having a wider width than the second extension portion.

The light blocking pattern may include a first light blocking pattern overlapping the first transistor and a second light blocking pattern overlapping the second transistor, and one of the first extension portion and the second extension portion may extend between the first light blocking pattern and the second light blocking pattern in a second direction that crosses the first direction.

The light blocking pattern may be formed in one piece and overlap both of the first transistor and the second transistor, and one of the first extension portion and the second extension portion may be disposed between one side of the light blocking pattern and a data line disposed adjacent to the light blocking pattern, and extends in a second direction that crosses the first direction.

The display device may further include a first color filter, a second color filter, and a third color filter that are disposed on the substrate and represent different colors, wherein the light blocking pattern may represent the same color as the first color filter, and the pixel electrode may overlap the second color filter or the third color filter.

The light blocking pattern may be formed of the first color filter and disposed between the substrate and the second color filter or the third color filter.

The display device may further include a first insulating layer that is disposed on the first transistor and the second transistor, wherein the light blocking pattern may be disposed between the first insulating layer and the second color filter or the third color filter.

The display device may further include a second insulating layer that is disposed on the first color filter, the second color filter, and the third color filter, wherein the first bridge may be connected with the first transistor through an opening formed through the first insulating layer and the second insulating layer, and the second bridge may be connected with the second transistor through an opening formed through the first insulating layer and the second insulating layer.

The light blocking pattern may overlap both of the first transistor and the second transistor, the first transistor may include a first drain electrode and an expansion portion of the first drain electrode, the second transistor may include a second drain electrode and an expansion portion of the second drain electrode. The expansion portion of the first drain electrode may be disposed between the light blocking pattern and the first subpixel electrode, and the expansion portion of the second drain electrode may be disposed between the light blocking pattern and the second subpixel electrode.

The light blocking pattern may include a portion extending in an oblique direction with respect to the first direction.

The light blocking pattern may be connected with the first color filter.

The gate line may be disposed between the first subpixel electrode and the second subpixel electrode.

The first subpixel electrode and the second subpixel electrode may be disposed at one side of the gate line.

A display device according to an embodiment includes: a plurality of pixels, the plurality of pixels including a first pixel, a second pixel and a third pixel. Each of the plurality of pixels includes a gate line that transmits a gate signal; a first transistor and a second transistor that are connected with the gate line; a first insulating layer that is disposed on the first transistor and the second transistor; a color filter; a pixel electrode that is disposed on the color filter, and includes a first subpixel electrode and a second subpixel electrode; a first bridge that connects the first subpixel electrode with the first transistor; and a second bridge that connects the second subpixel electrode and the second transistor; and a light blocking pattern that is disposed between the first insulating layer and the color filter in at least one of the second pixel and the third pixel not to overlap the first bridge and the second bridge in a plan view.

The first bridge may include a first extension portion connected with the first subpixel electrode and a first contact portion connected with the first extension portion, and the second bridge may include a second extension portion connected with the second subpixel electrode and a second contact portion connected with the second extension portion.

The display device may further include a second insulating layer that is disposed between the color filter and the pixel electrode, wherein the first subpixel electrode, the second subpixel electrode, the first extension portion, and the second extension portion may be disposed on the second insulating layer, and the first bridge and the second bridge may be respectively connected with the first transistor and the second transistor through an opening formed through f the first insulating layer and the second insulating layer.

The color filter may include a first color filter disposed in the first pixel, a second color filter disposed in the second pixel, and a third color filter t disposed in the third pixel that respectively represent different colors, wherein the light blocking pattern may represent the same color as the first color filter.

The light blocking pattern may be connected with the first color filter.

The light blocking pattern may overlap the second color filter and the third color filter.

According to exemplary embodiments, it is possible to block the light that can be incident on the transistor to prevent the physical and electric characteristics of the transistor from changing, and to prevent the failure of disconnection between the pixel electrode and the transistor. In addition, even if not specifically mentioned, embodiments can obtain an effect that can be recognized throughout the specification.

DETAILED DESCRIPTION OF THE EMBODIMENTS

Figure 1:
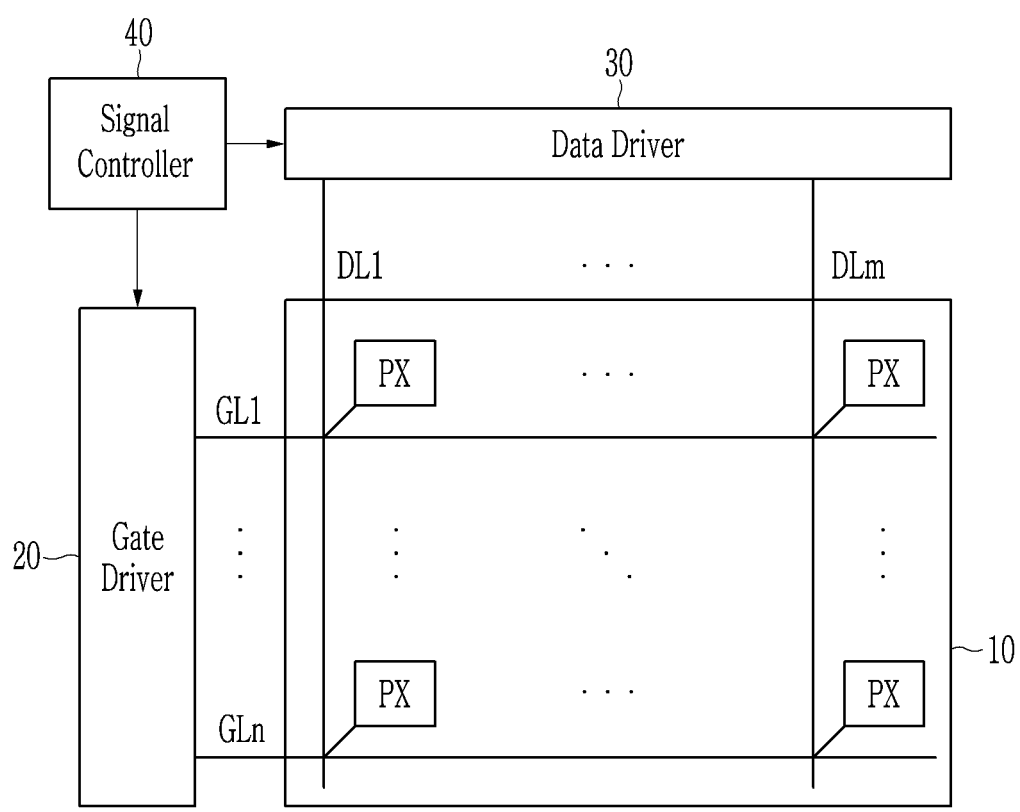
FIG. 1 is a layout view of a display device according to an embodiment.

Hereinafter, embodiments of the inventive concept will be described in detail with reference to the accompanying drawings so that those skilled in the technical field to which the inventive concept pertains may carry out the embodiments.

Further, since a size and a thickness of each element illustrated in the drawings are arbitrarily illustrated for convenience of description. In the drawings, the thicknesses of layers and regions are exaggerated for convenience of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Throughout the specification, like reference numerals designate like elements throughout the specification.

Throughout the specification, unless explicitly described to the contrary, the word "comprise" and variations such as "comprises" or "comprising" will be understood to imply the inclusion of stated elements but not the exclusion of any other elements.

Throughout the specification, the phrase "on a plane" means viewing a target portion from the top, and the phrase "on a cross-section" means viewing a cross-section formed by vertically cutting a target portion from the side.

In the drawings, reference numeral x used to indicate a first direction, y is a second direction perpendicular to the first direction, and z is a third direction perpendicular to the first direction and the second direction.

The entire configuration of a display device according to an embodiment will be described with reference to FIG. 1.

FIG. 1 is a layout view of a display device according to an embodiment.

Referring to FIG. 1, a display device may include a display panel 10, a gate driver 20, a data driver 30, and a signal controller 40.

The display panel 10 includes gate lines GL1 to GLn, data lines DL1 to DLm, and pixels PX that are connected with the gate lines GL1 to GLn and the data lines DL1 to DLm which extend substantially in directions substantially perpendicular to each other. The gate lines GL1 to GLn may extend substantially in a row direction, and the data lines DL1 to DLm may extend substantially in a column direction. Each pixel PX may receive a gate signal that includes a gate on signal that turns on a transistor, which is a switch, and a gate off voltage that turns off the transistor through the gate lines GL1 to GLn, and may receive a data voltage corresponding to a video signal through the data lines DL1 to DLm when the transistor is in the turned-on state.

The signal controller 40 may control the gate driver 20 and the data driver 30. The signal controller 40 receives a video signal from an external device such as a graphics controller and a control signal thereof, properly processes the video signal to an operation condition of the display panel 10, and then generates and outputs video data, a gate control signal, and a data control signal. The gate driver 20 receives the gate control signal from the signal controller 40, and generates a gate signal and outputs the gate signal to the gate lines GL1 to GLn. The data driver 30 receives the data control signal and the video data from the signal controller 40, and converts the video data to a data voltage by using a gray voltage generated from a gray voltage generator (not shown) and outputs the data voltage to the data lines DL1 to DLm.

Referring to FIG. 2, FIG. 3, FIG. 4, and FIG. 5, the display device according to the embodiment will be described, while mainly focusing on a pixel area.

Figure 2:
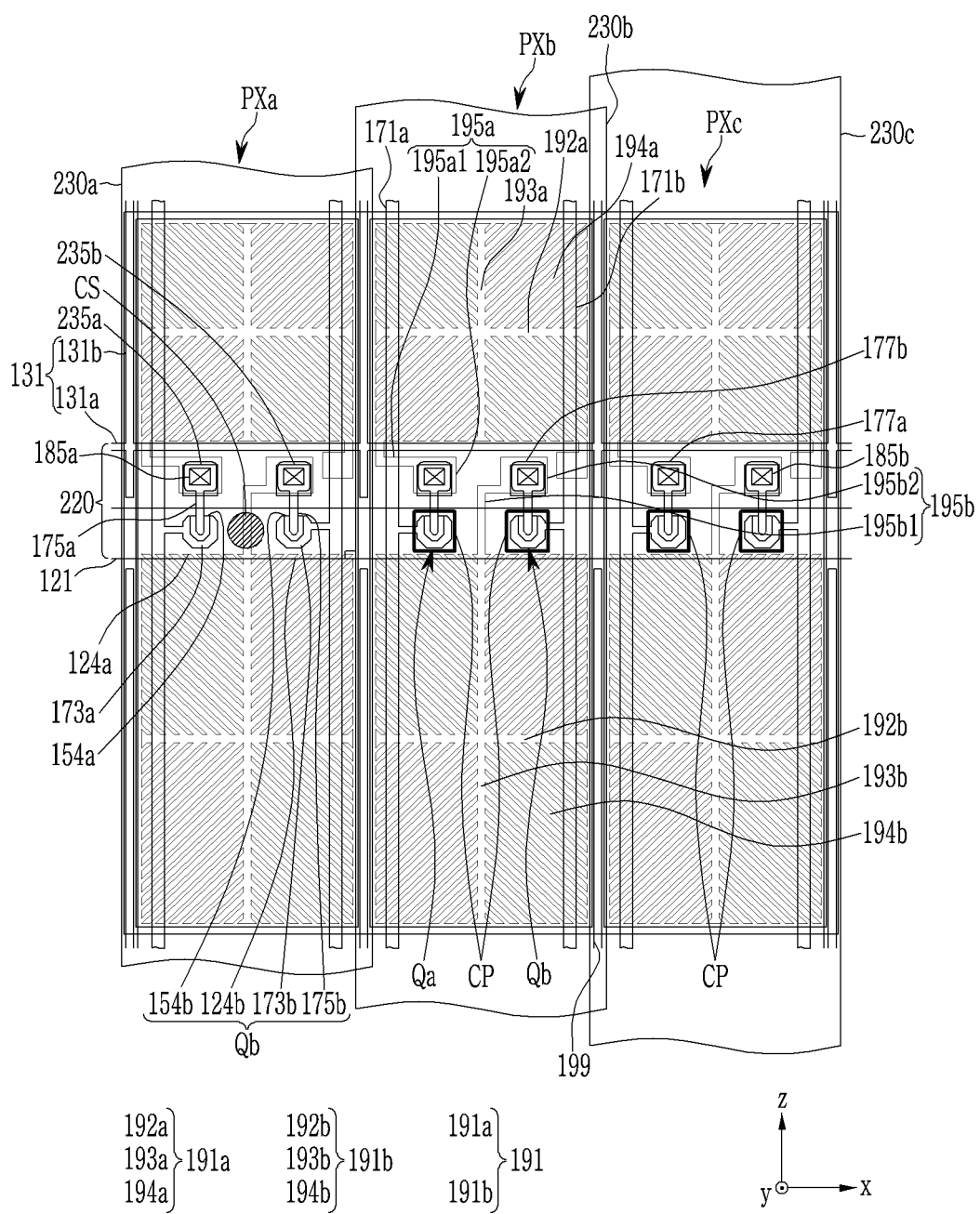
FIG. 2 is a plan view of three pixels that neighbor each other in the display device according to the embodiment.
Figure 3:
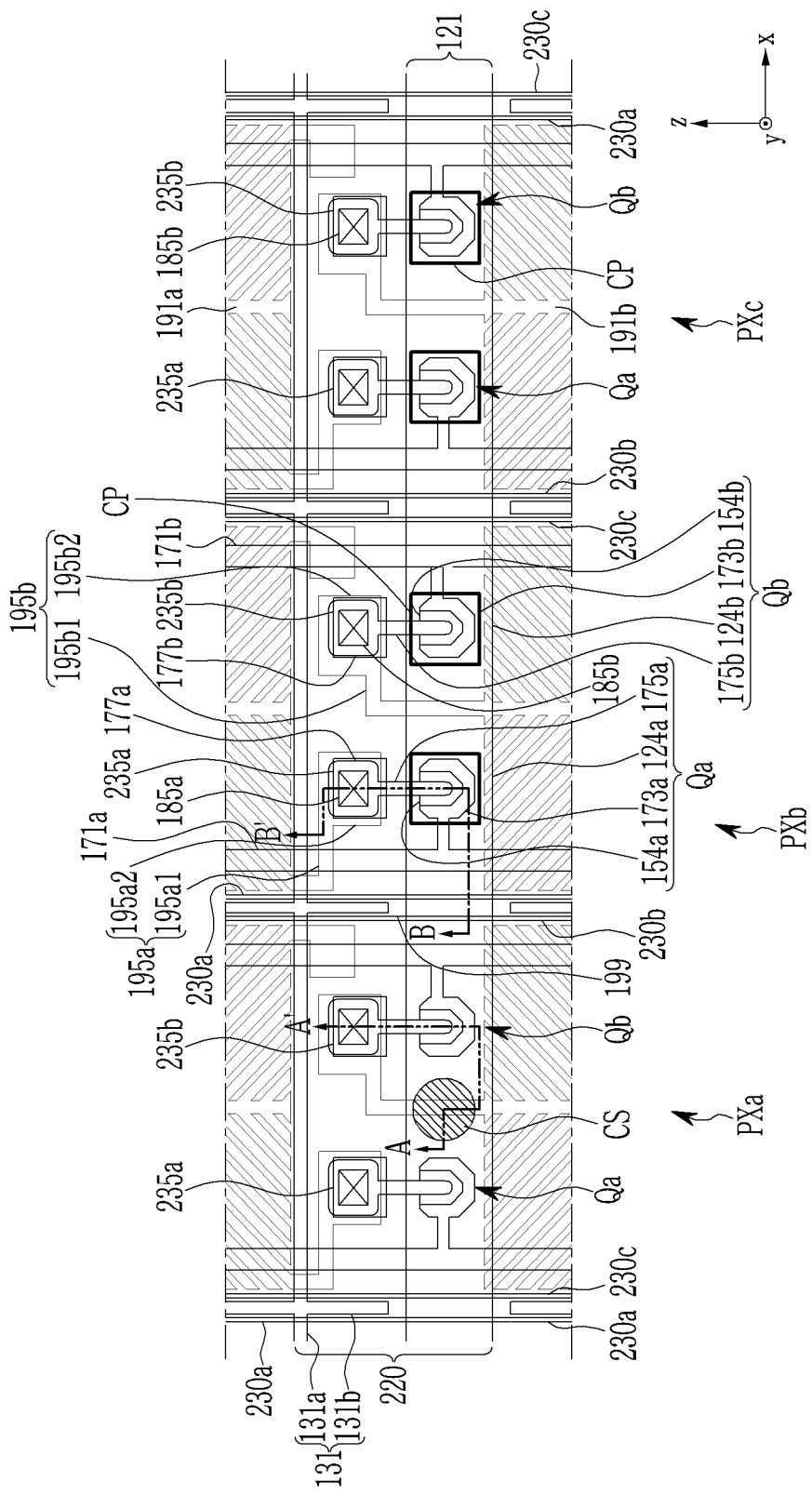
FIG. 3 is an enlarged view of an area where transistors and openings of FIG. 2 are located.
Figure 4:
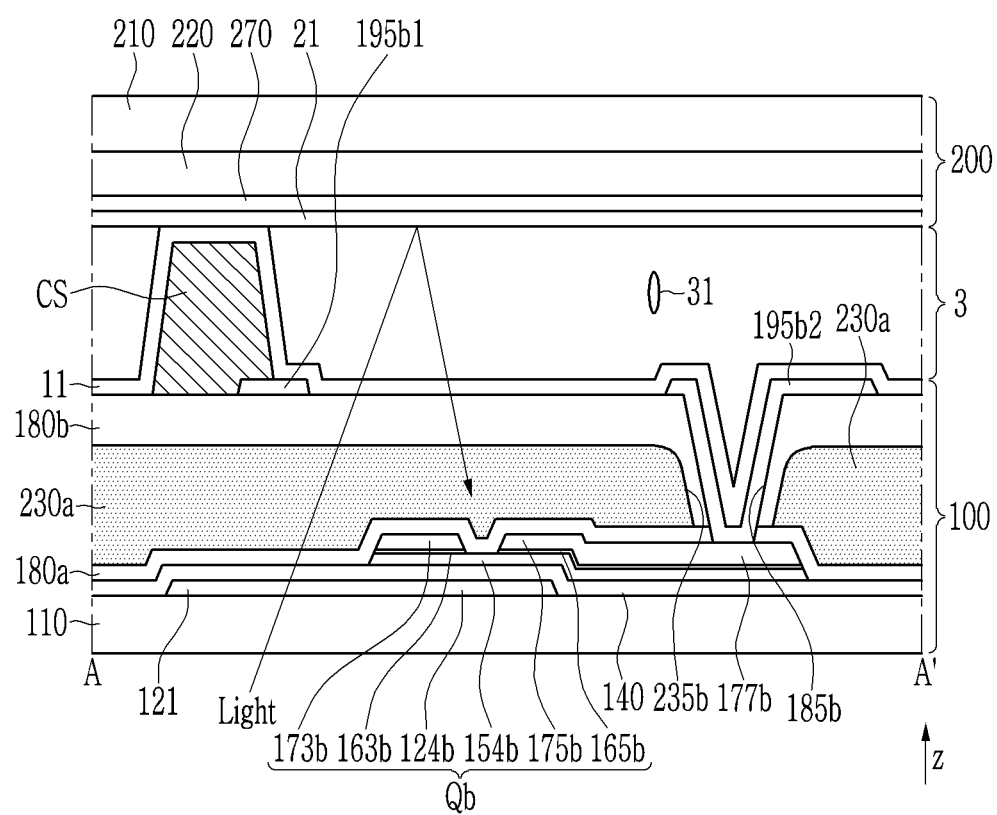
FIG. 4 is a cross-sectional view of FIG. 3, taken along the line A-A'.
Figure 5:
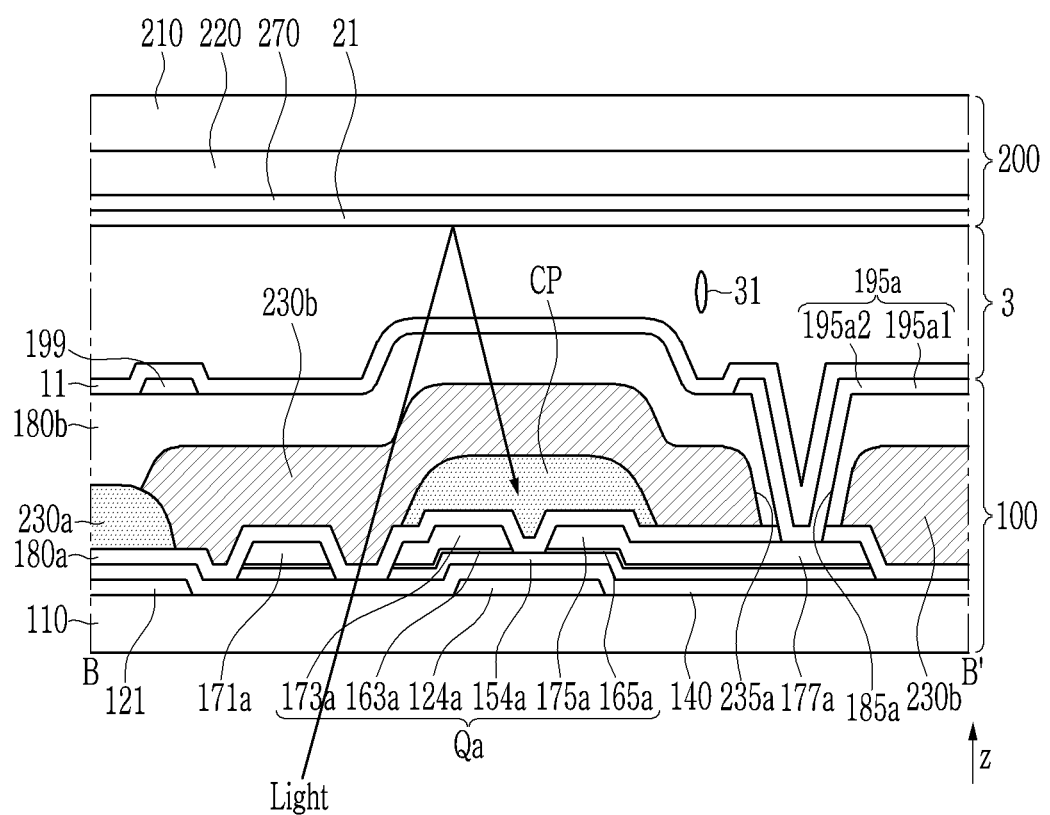
FIG. 5 is a cross-sectional view of FIG. 3, taken along the line B-B'.

FIG. 2 is a plan view of three pixels that neighbor each other in the display device according to the embodiment, FIG. 3 is an enlarged view of an area where transistors and openings are located in FIG. 2, FIG. 4 is a cross-sectional view of FIG. 3, taken along the line A-A', and FIG. 5 is a cross-sectional view of FIG. 3, taken along the line B-B'.

In FIG. 2, three pixels, which are a first pixel PXa, a second pixel PXb, and a third pixel PXc, neighboring in a first direction x, which is the row direction, are illustrated. A group of pixels including the first, second, and third pixels PXa, PXb, and PXc may be iteratively disposed in the first direction x and a second direction y.

Referring to FIG. 2, FIG. 3, FIG. 4, and FIG. 5, the display panel 10 of the display device may include a first display panel 100, a second display panel 200, and a liquid crystal layer 3 disposed between the first display panel 100 and the second display panel 200.

The first display panel 100 may include a first substrate 110 that can be formed of a transparent insulator, such as glass. A gate conductive layer that includes a gate line 121 and a storage electrode line 131 may be disposed on the first substrate 110.

The gate line 121 transmitting a gate signal may extend substantially in the first direction x. A part or a protrusion of the gate line 121 may form a first gate electrode 124a and a second gate electrode 124b, which are disposed in each of the pixels PXa, PXb, and PXc. In the present specification, the protrusion implies a portion that is protruded in a plane view.

The storage electrode line 131 may include a first portion 131a that extends substantially in the first direction x and a second portion 131b that extends substantially in the second direction y. The second portion 131b may extend along a boundary between two neighboring pixels PXa, PXb, and PXc.

The gate conductive layer may include a metal such as molybdenum (Mo), copper (Cu), aluminum (Al), magnesium (Mg), silver (Ag), gold (Au), platinum (Pt), palladium (Pd), nickel (Ni), neodymium Nd, iridium (Ir), tungsten (W), titanium (Ti), chromium (Cr), tantalum (Ta), or the like.

A gate insulating layer 140 that may include an inorganic insulating material such as a silicon oxide ($SiO_x$), a silicon nitride ($SiN_x$), and the like may be disposed on the gate conductive layer.

A semiconductor layer including a first semiconductor layer 154a and a second semiconductor layer 154b may be disposed on the gate insulating layer 140. The first semiconductor layer 154a may overlap the first gate electrode 124a, and the second semiconductor layer 154b may overlap the second gate electrode 124b. The semiconductor layer may include a semiconductor material such as amorphous silicon, polysilicon, a metal oxide, and the like.

Ohmic contact layers 163a and 165a may be disposed on the semiconductor layer. The Ohmic contact layers 163a and 165a may be formed of a material such as silicon or n+ hydrogenated amorphous silicon that is highly doped with an n-type impurity.

A data conductive layer that includes data lines including a first data line 171a and a second data line 171b, a first drain electrode 175a, and a second drain electrode 175b may be disposed on the Ohmic contact layers 163a and 165a.

The first and second data lines 171a and 171b each transmitting the data voltage may extend substantially in the second direction y. Each of the first data line 171a and the second data line 171b connected with each of the pixels PXa, PXb, and PXc may transmit a data voltage that may represent different luminance with respect to a single video signal. For example, a data voltage transmitted by the second data line 171b in response to a video signal of a grayscale may be lower than a data voltage transmitted by the first data line 171a in response to the same video signal. In such a configuration, a charge voltage of a second liquid crystal capacitor formed by a second subpixel electrode 191b, a common electrode 270, and a liquid crystal layer 3 formed therebetween may be set to be lower than a charge voltage of a first liquid crystal capacitor formed by a first subpixel electrode 191a, the common electrode 270, and the liquid crystal layer 3 formed therebetween. As a result, luminance of an area that overlaps the first subpixel electrode 191a and luminance of an area that overlaps the second subpixel electrode 191b in one pixel PX may be set to be different from each other, and thus an image viewed from a side may be as similar as possible to an image viewed from the front, thereby improving side visibility.

A part of a protrusion of the first data line 171a may form a first source electrode 173a of each of the pixels PXa, PXb, and PXc, and a part of a protrusion of the second data line 171b may form a second source electrode 173b of each of the pixels PXa, PXb, and PXc. The first drain electrode 175a and the second drain electrode 175b may include expansion portions 177a and 177b, each having a wider width than another portion.

The first gate electrode 124a, the first source electrode 173a, and the first drain electrode 175a may form a first transistor Qa together with the first semiconductor layer 154a. The second gate electrode 124b, the second source electrode 173b, and the second drain electrode 175b may form a second transistor Qb together with the second semiconductor layer 154b. A channel of the first transistor Qa may be formed in a portion between the first source electrode 173a and the first drain electrode 175a in the first semiconductor layer 154a. A channel of the second transistor Qb may be formed in a portion between the second source electrode 173b and the second drain electrode 175b in the second semiconductor layer 154b. The first and second transistors Qa and Qb are electrically connected to the same gate line 121, and may simultaneously receive a gate signal transmitted through the same gate line 121.

In each of the transistors Qa and Qb, the source electrodes 173a and 173b and the drain electrodes 175a and 175b may be interchangeable. For example, a portion marked by reference numeral 173a in the first transistor Qa may be a drain electrode, and a portion marked by reference numeral 175a may be a source electrode. Thus, the expansion portion 177a may be an expansion portion 177a of the source electrode of the first transistor Qa, and the expansion portion 177b may be an expansion portion 177b of the source electrode of the second transistor Qb.

Regarding the relative positions of the first and second transistors Qa and Qb in each of the pixels PXa, PXb, and PXb, in the illustrated embodiment, the first transistor Qa may be disposed on the left side and the second transistor Qb may be disposed on the right side. However, they may be interchangeable too. In addition, in some pixels, the first transistor Qa may be disposed at the left side, and in some pixels, the second transistor Qb may be disposed in the left side.

The data conductive layer may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or the like.

The first and second transistors Qa and Qb disposed in each of the pixels PXa, PXb, and PXc may be arranged substantially in the first direction x. The first and second transistors Qa and Qb may be disposed between the first data line 171a and the second data line 171b that correspond to each of the pixels PXa, PXb, and PXc.

A first insulating layer 180a may be disposed on the data conductive layer. The first insulating layer 180a may include an inorganic insulating material such as a silicon nitride, a silicon oxide, and/or the like. The first insulating layer 180a may include an organic insulating material.

A color filter layer that includes color filters 230a, 230b, and 230c and a light blocking pattern CP may be disposed on the first insulating layer 180a.

Each of the color filters 230a, 230b, and 230c may display one of primary colors such as red, green, and blue. For example, a first color filter 230a may display red, a second color filter 230b may display green, and a third color filter 230c may display blue. Alternatively, the first color filter 230a may display red, the second color filter 230b may display blue, and the third color filter 230c may display green.

The first color filter 230a may be disposed corresponding to the first pixel PXa, the second color filter 230b may be disposed corresponding to the second pixel PXb, and the third color filter 230c may be disposed corresponding to the third pixel PXc. That is, the first color filter 230a may overlap the first pixel PXa, the second color filter 230b may overlap the second pixel PXb, and the third color filter 230c may overlap the third pixel PXc. Each of the color filters 230a, 230b, and 230c may correspond to pixels arranged along the second direction y and arranged in one column. Color filters of a group including the first, second, and third color filters 230a, 230b, and 230c may be iteratively arranged in the first direction x.

Color filters neighboring each other at a boundary of two neighboring pixels of PXa, PXb, and PXc may overlap each other. For example, the first color filter 230a may overlap the second color filter 230b at a boundary of neighboring first and second pixels PXa and PXb. An overlapped portion of the first and second color filters 230a and 230b may overlap the second portion 131b of the storage electrode line 131. An overlapped portion of color filters 230a, 230b, and 230c at a boundary of two neighboring pixels may prevent light leakage between the two neighboring pixels.

The first color filter 230a may be formed before the second color filter 230b and the third color filter 230c are formed. Thus, the second color filter 230b may be disposed on the first color filter 230a in an area where the first color filter 230a and the second color filter 230b are overlapped with other, and the third color filter 230c may be disposed on the first color filter 230a in an area where the first color filter 230a and the third color filter 230c are overlapped with each other.

Each of the color filters 230a, 230b, and 230c may include openings 235a and 235b that respectively overlap the expansion portions 177a and 177b of the first and second drain electrodes 175a and 175b.

The light blocking pattern CP may be formed of the same material through the same process as the first color filter 230a. For example, a layer having a predetermined thickness is formed with a material (e.g., a pigment-dispersed photoresist) that can represents a first color on the first insulating layer 180a, and then the layer is patterned through a photolithography process such that the first color filter 230a and the light blocking pattern CP can be formed together. Accordingly, the light blocking pattern CP may represent the same color as the first color filter 230a, and may be disposed on the same layer where the first color filter 230a is disposed. For example, when the first color filter 230a represents red, the light blocking pattern CP may also represent red. The light blocking pattern CP may be disposed between the first insulating layer 180a and the second and third color filters 230b and 230c. The second and third color filters 230b and 230c may cover the light blocking pattern CP.

The light blocking pattern CP may be disposed in the second and third pixels PXb and PXc where the second and third color filters 230b and 230c that represent different colors from that of the first color filter 230a. The light blocking pattern CP may be spaced apart from the first color filter 230a or the first pixel PXa representing the same color as the light blocking pattern CP. Although the light blocking pattern CP has an approximately quadrangular shape, the light blocking pattern CP may have various shapes, for example, a circular shape.

The light blocking patterns CP disposed in the second and third pixels PXb and PXc may overlap the first and second transistors Qa and Qb. In particular, the light blocking patterns CP may respectively overlap channels of the first and second semiconductor layers 154a and 154b of the first and second transistors Qa and Qb. The number of light blocking patterns CP disposed in each of the pixels PXb and PXc may correspond to the number of transistors included in the pixel. In the illustrated embodiment, two light blocking patterns CP are disposed in each of the second pixel PXb and the third pixel PXc.

The light blocking pattern CP absorbs light towards the first and second transistors Qa and Qb, particularly, towards channels of the transistors Qa and Qb from above the channels, for example, light incident from below the first display panel 100 and reflected toward the first and second transistors Qa and Qb by the second display panel 200, thereby prevent light from reaching the channels. Accordingly, the light blocking pattern CP may prevent the physical properties and electrical characteristics of the first and second transistors Qa and Qb from being changed by light. Through this, it is possible to improve an initial threshold voltage characteristic of the first and second transistors Qa and Qb, reduce the amount of change in the threshold voltage, prevent a current leakage of the display device, and reduce the color change, thereby improving display quality and reliability. Because the light blocking pattern CP may be formed with the first color filter 230a, no additional process step for forming the light blocking pattern CP is required.

A second insulating layer 180b may be disposed on the color filter layer. The second insulating layer 180b may include an organic insulating material or an inorganic insulating material. The second insulating layer 180b may provide a generally flat top surface. The second insulating layer 180b may prevent the color filter layer from being exposed, and prevent an impurity such as a pigment in the color filter layer from flowing into the liquid crystal layer 3. The second insulating layer 180b may be called a planarization layer or an overcoat layer.

The first insulating layer 180a, the second insulating layer 180b and each of the color filter layers 230a, 230b and 230c may include an opening 185a that overlaps the expansion portion 177a of the first drain electrode 175a and an opening 185b that overlaps the expansion portion 177b of second drain electrode 175b.

A pixel electrode layer that includes a pixel electrode 191 including a first subpixel electrode 191a and a second subpixel electrode 191b, a first bridge 195a, a second bridge 195b, and a shield electrode 199 may be disposed on the second insulating layer 180b.

A pixel electrode 191 of the first pixel PXa may overlap the first color filter 230a, a pixel electrode 191 of the second pixel PXb may overlap the second color filter 230b, and a pixel electrode of the third pixel PXc may overlap the third color filter 230c.

The first subpixel electrode 191a and the second subpixel electrode 191b may be physically separated from each other. In each pixel PXa, PXb, and PXc, a first subpixel electrode 191a may be disposed on one side and a second subpixel electrode 191b may be disposed on the other side of a light blocking member 220 which overlaps the first and second transistors Qa and Qb.

The first subpixel electrode 191a and the second subpixel electrode 191b may each have a quadrangle shape.

The first subpixel electrode 191a and the second subpixel electrode 191b may include cross-shaped stem portions including horizontal stem portions 192a and 192b and vertical stem portions 193a and 193b, and branch portions 194a and 194b extending in an oblique direction from the cross-shaped stem portions. With such a structure, each subpixel electrode 191a and 191b may be divided into a plurality of areas (e.g., four areas), and a direction of liquid crystal molecules 31 of the liquid crystal layer 3 inclined in each of the plurality of areas is controlled to be different from one another such that a wide viewing angle can be realized, and the first subpixel electrode 191a may be smaller than the second subpixel electrode 191b. The first subpixel electrode 191a and the second subpixel electrode 191b may not overlap the light blocking pattern CP.

The first bridge 195a may include an extension portion 195a1 protruding from the first subpixel electrode 191a and a contact portion 195a2 having a wider width than the extension portion 195a1. The contact portion 195a2 may overlap the expansion portion 177a of the first drain electrode 175a. The second bridge 195b may include an extension portion 195b1 protruding from the second subpixel electrode 191b and a contact portion 195b2 having a wider width than the extension portion 195b1. The contact portion 195b2 may overlap the expansion portion 177b of the second drain electrode 175b. The contact portion 195a2 may be connected with the expansion portion 177a of the first drain electrode 175a through the opening 185a, and the contact portion 195b2 may be connected with the expansion portion 177b of the second drain electrode 175b through the opening 185b. Accordingly, when the first transistor Qa and the second transistor Qb are turned on, the first subpixel electrode 191a and the second subpixel electrode 191b may receive a data voltage from the first drain electrode 175a and the second drain electrode 175b, respectively.

The first bridge 195a and the second bridge 195b may be disposed not to be overlapped with the light blocking pattern CP. Because the second color filter 230b or the third color filter 230c is disposed on the light blocking pattern CP, an area overlapping the light blocking pattern (CP) may be higher than other areas, as shown in FIG. 5. Therefore, when the first bridge 195a or the second bridge 195b is disposed on the second insulating layer 180b to overlap the light blocking pattern CP, and an external force is applied to the first bridge 195a or the second bridge 195b in a polishing process for removing foreign matter from the upper surface of the first display panel 100, or the first bridge 195a or the second bridge 195b may be damaged or removed. As a result, a disconnection between the first subpixel electrode 191a and the first drain electrode 175a and/or a disconnection between the second subpixel electrode 191b and the second drain electrode 175b may occur, thus a pixel defect may occur. The first bridge 195a and the second bridge 195b may be disposed so that interference does not occur between the light blocking patterns CP, and the first bridge 195a and the second bridge 195b may be disposed so as not to cross the light blocking patterns CP, and accordingly, an occurrence of defects in the display device can be reduced.

In the illustrated embodiment, interference with the light blocking patterns CP may occur in the extension portions 195a1 and 195b1 of the first bridge 195a and the second bridge 195b, and may particularly cause a problem in the extension portion 195b1 connected with the second subpixel electrode 191b. This is because the extension portion 195b1 includes a portion that extends in the second direction y while crossing an area where the light blocking patterns CP are arranged in the first direction x. In such a configuration, the extension portion 195b1 is disposed between two neighboring light blocking patterns CP not to overlap or cross the light blocking pattern CP.

The shield electrode 199 may include a horizontal portion extending in the first direction x and/or a vertical portion extending in the second direction y. The shield electrode 199 may be disposed between pixels PXa, PXb, and PXc neighboring each other in the first direction x and/or pixels PXa, PXb, and PXc neighboring each other in the second direction y. The shield electrode 199 may shield an electric field of the data lines 171a and 171b and/or gate lines 121 from affecting the liquid crystal layer 3 or the subpixel electrodes 191a and 191b. A voltage that is the same as a voltage (i.e., a common voltage) applied to the common electrode 270 may be applied to the shield electrode 199. In this case, because there is no potential difference between the shielding electrode 199 and the common electrode 270, the liquid crystal molecules 31 between the shielding electrode 199 and the common electrode 270 may not be rearranged. Thus, in a display device in a normally black mode, the shield electrode 199 can function as a light blocking member.

The pixel electrode layer may be formed by forming a conductive layer with a transparent conductive material such as indium tin oxide (ITO), indium zinc oxide (IZO), or the like on the second insulating layer 180b, and then patterning the conductive layer through a photolithography process. The first bridge 195a may be integrally formed with the first subpixel electrode 191a, and the second bridge 195b may be integrally formed with the second subpixel electrode 191b.

A spacer CS may be disposed on the second insulating layer 180b and the pixel electrode layer to maintain a gap between the first display panel 100 and the second display panel 200. The spacer CS may be disposed to overlap the first color filter 230a. As shown in the drawing, the spacer CS may include a main spacer CS having a height corresponding to the gap between the first display panel 100 and the second display panel 200, and a sub spacer having a lower height than that of the main spacer CS.

A first alignment layer 11 may be disposed on the pixel electrode layer. The first alignment layer 11 may be a vertical alignment layer.

The second display panel 200 may include a second substrate 210 that can be formed of a transparent insulator such as glass. A light blocking member 220, for example, a black matrix, may be disposed on the second substrate 210 to prevent light leakage. The light blocking member 220 may include a portion that extends in the first direction x between the first subpixel electrode 191a and the second subpixel electrode 191b and overlaps the first and second transistors Qa and Qb. The light blocking member 220 may be disposed on the first display panel 100.

The common electrode 270 may be disposed on the light blocking member 220. The common electrode 270 may be applied with a common voltage having a constant magnitude. The common electrode 270 may include a transparent conductive material such as ITO, IZO, or the like.

A second alignment layer 21, which may be a vertical alignment layer, may be disposed on the common electrode 270.

The liquid crystal layer 3 disposed between the first display panel 100 and the second display panel 200 includes liquid crystal molecules 31. The liquid crystal molecules 31 may have negative dielectric anisotropy and may be oriented in a direction approximately perpendicular to the first and second substrates 110 and 210 when no electric field is applied in the liquid crystal layer 3. The liquid crystal molecules 31 may pretilt in a predetermined direction when no electric field is generated in the liquid crystal layer 3. For example, the liquid crystal molecules 31 may be inclined with a pretilt in a direction approximately parallel to the branch portions 194a and 194b of the first and second subpixel electrodes 191a and 191b.

A backlight that provides light may be disposed below or behind the first display panel 100. As shown in FIG. 5, when the light from the backlight passes between the gate conductive layer and the data conductive layer and is reflected from the common electrode 270 of the second display panel 200, and is then incident toward the first transistor Qa or the second transistor Qb of the first display panel 100 again, most of the light may be absorbed in the color filter layer 230b and the light blocking pattern CP, thus the reliability of the display device can be increased.

Hereinafter, embodiments will be described based on differences from the embodiments described above.

Figure 6:
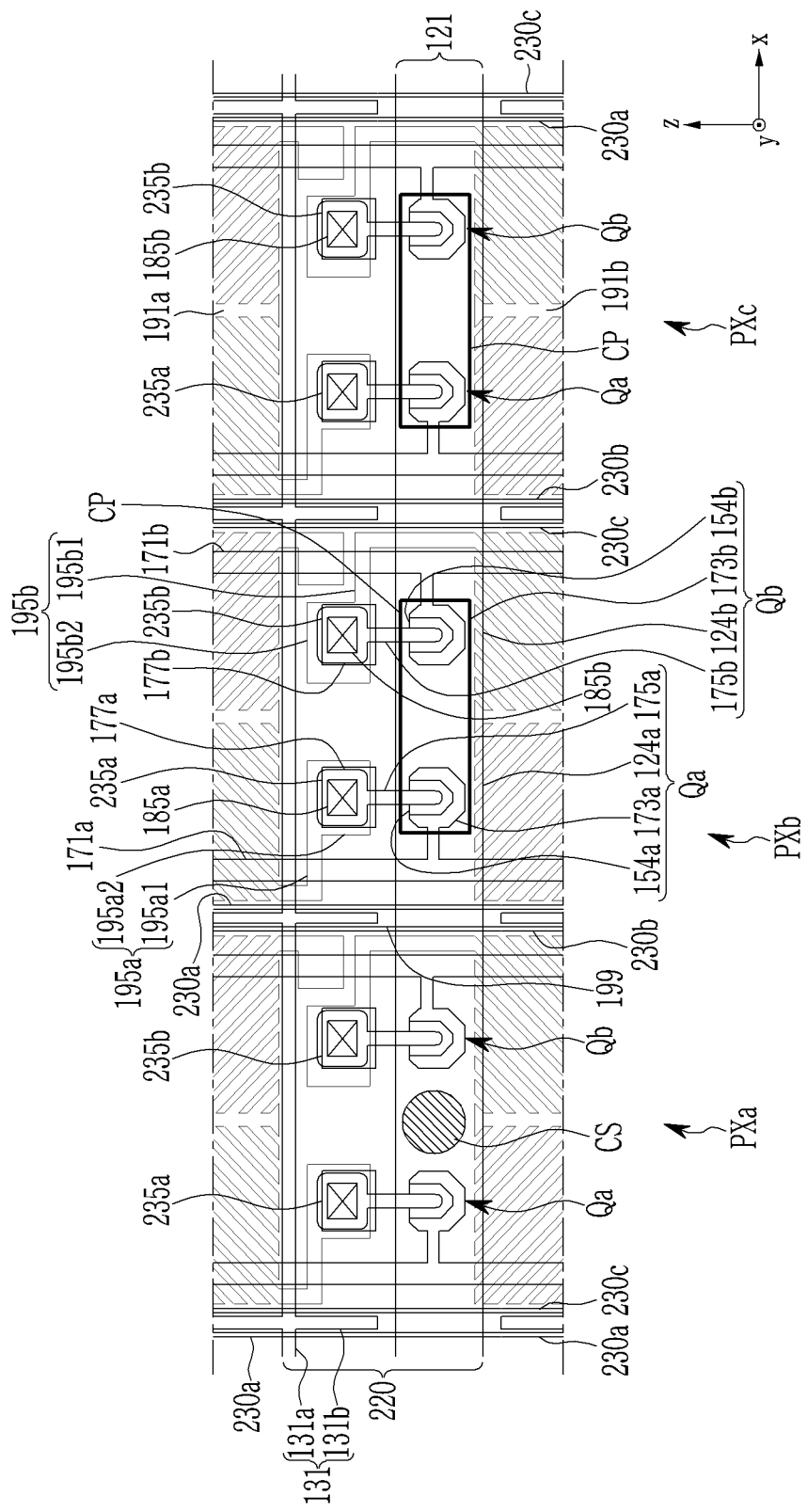
FIG. 6 is a plan view of an area where a transistor and an opening are disposed in three neighboring pixels in a display device of an embodiment.
Figure 7:
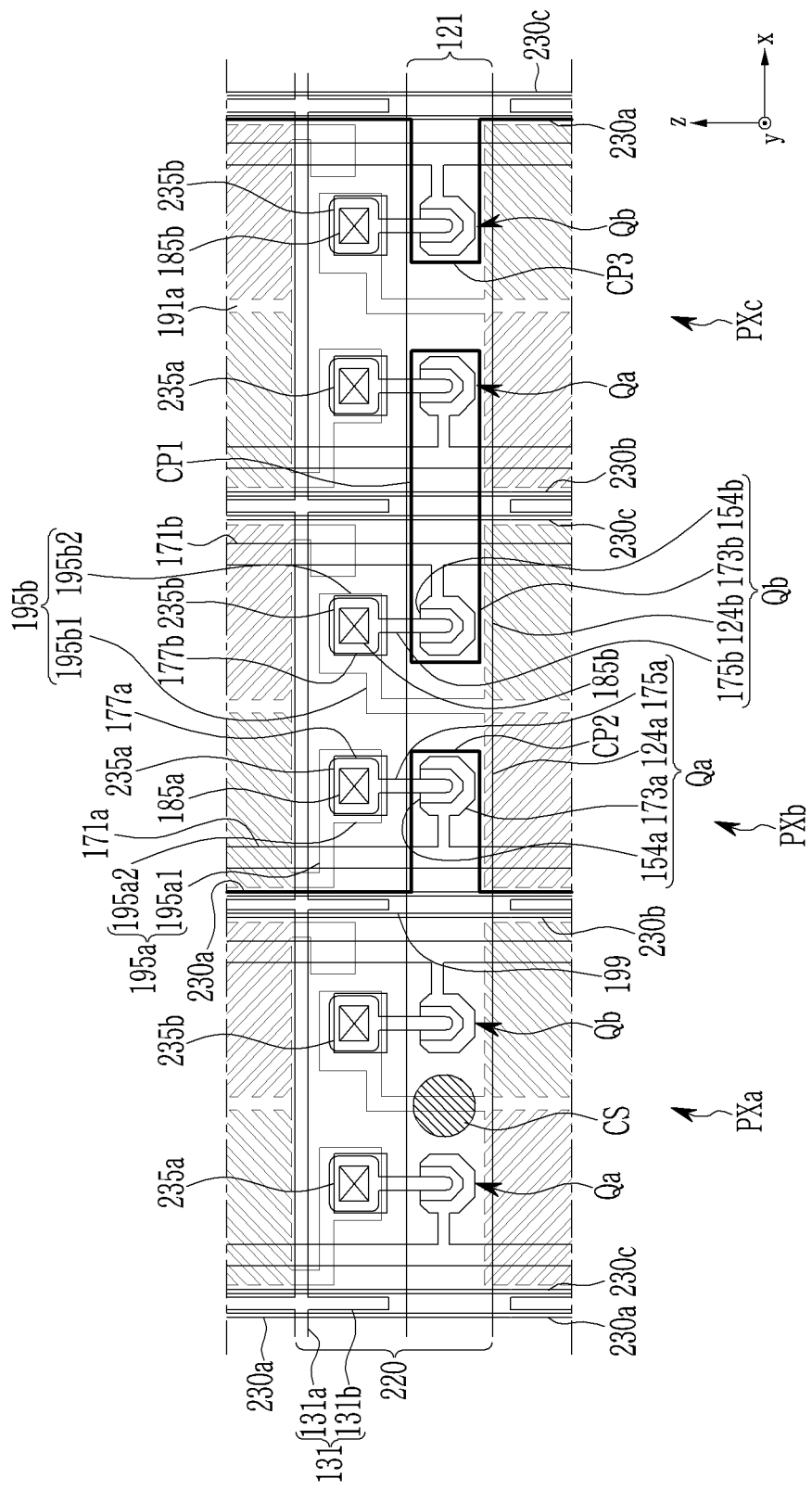
FIG. 7 is a plan view of an area where a transistor and an opening are disposed in three neighboring pixels in a display device of an embodiment.
Figure 8:
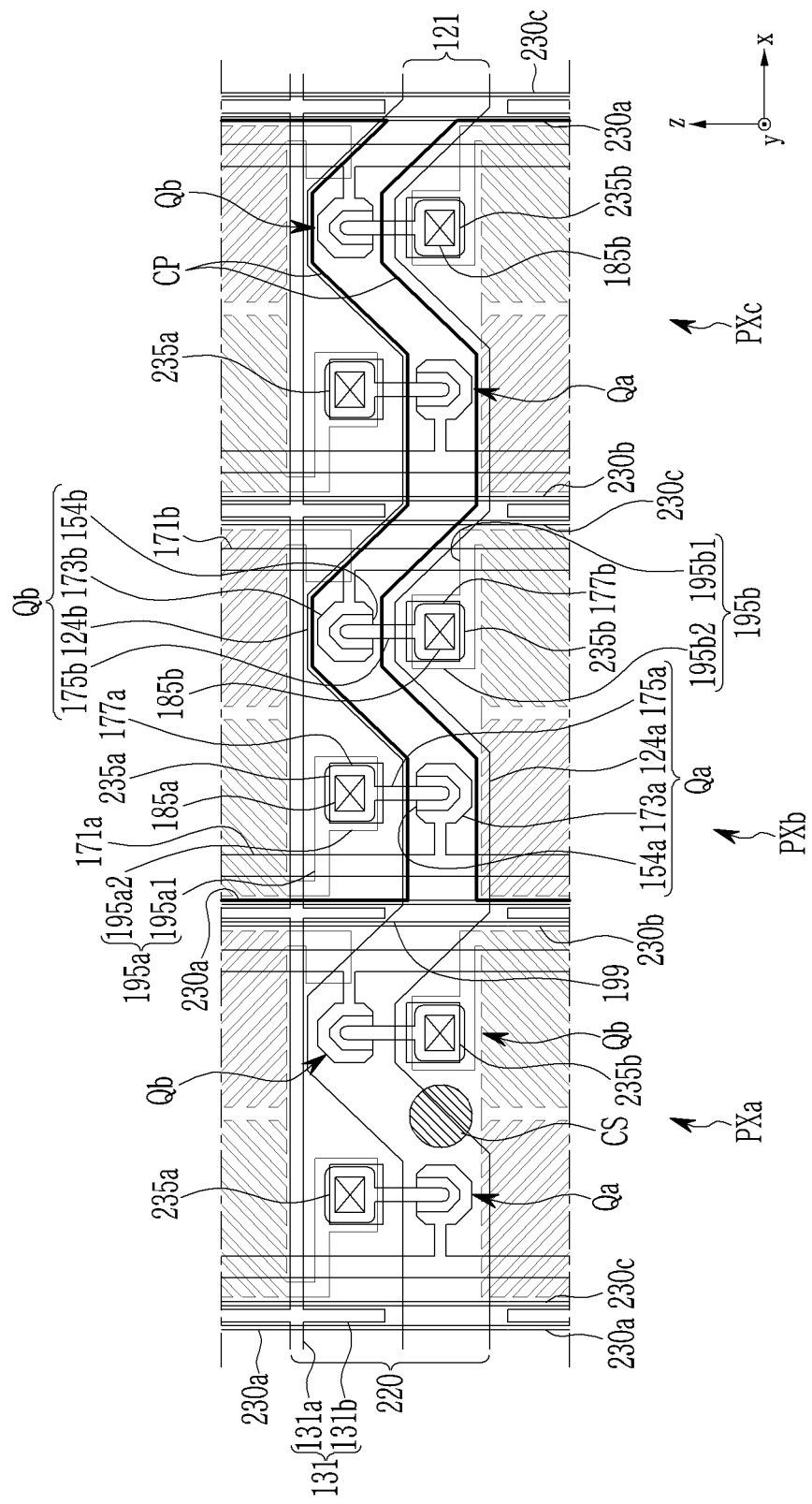
FIG. 8 is a plan view of an area where a transistor and an opening are disposed in three neighboring pixels in a display device of an embodiment.

FIG. 6, FIG. 7, and FIG. 8 are planar layout views of areas where transistors and openings are disposed in three neighboring pixels in display devices of embodiments. The areas respectively illustrated in FIG. 6, FIG. 7, and FIG. 8 may be substantially the same as the area shown in FIG. 3.

The embodiments of FIG. 6, FIG. 7, and FIG. 8 are respectively different from the embodiment of FIG. 3 in the shape and the layout of the light blocking patterns CP and the second bridges 195b.

First, referring to FIG. 6, light blocking patterns CP according to the embodiment may be respectively disposed in a second pixel PXb and a third pixel PXc. In each of the second and third pixels PXb and PXc, the light blocking patterns CP may overlap both of the first transistor Qa and the second transistor Qb. That is, the light blocking patterns CP may have a long shape along the first direction x so as to overlap all of the first transistor Qa and the second transistor Qb, and one light blocking pattern CP may be disposed in each of the pixels PXb and PXc. As described, when the light blocking pattern CP is formed, the size of the light blocking pattern CP may be increased as compared to the above-described embodiment of FIG. 3.

The light blocking pattern CP may be formed with the same material as the first color filter 230a through the same process thereof, and thus it may be difficult to control the thickness and the size thereof. Therefore, when the size of the light blocking pattern CP is increased, the size uniformity of the light blocking patterns CP can be effectively managed in a manufacturing process of the display device, and it may be easy to form the light blocking pattern CP in a high-resolution display device. In addition, because the area of the light blocking pattern CP contacting a layer disposed therebelow, that is, the first insulating layer 180a, is increased, adhesion of the light blocking pattern CP to the layer disposed therebelow is increased such that peeling of the light blocking pattern CP can be reduced.

As such, when the second bridge 195b is formed in the above-described embodiment, the extension portion 195b1 of the second bridge 195b may cross and overlap the light blocking pattern CP if the extension portion 195b1 of the second bridge 195b is formed between the first transistor Qa and the second transistor Qb. Accordingly, the extension portion 195b1 may be formed to bypass the light blocking pattern CP disposed between the first transistor Qa and the second transistor Qb to right or left of the light blocking pattern CP in the second direction without passing between the first and second transistors Qa and Qb of one pixel of PXb and PXc. For example, the extension portion 195b1 connected with the second subpixel electrode 191b of the second pixel PXb may extend between the light blocking pattern CP and the third pixel PXc without overlapping the light blocking pattern CP. The extension portion 195b1 connected with the second subpixel electrode 191b of the third pixel PXc may extend without overlapping the light blocking pattern CP between the light blocking pattern CP and the first pixel PXa.

Referring to FIG. 7, a light blocking pattern according to the embodiment may include a first light blocking pattern CP1, a second light blocking pattern CP2, and a third light blocking pattern CP3. The first, second, and third light blocking patterns CP1, CP2, and CP3 may all be formed of the same material in the same process as a first color filter 230a.

The first light blocking pattern CP1 is spaced apart from the first color filter 230a and the first pixel PXa, and may be continuously formed over the neighboring second and third pixels PXb and PXc. Specifically, the first light blocking pattern CP1 may overlap both the second transistor Qb of the second pixel PXb and the first transistor Qa of the third pixel PXc. The first light blocking pattern CP1 may overlap the second data line 171b connected with the second transistor Qb of the second pixel PXb, and the first data line 171a connected with the first transistor Qa of the third pixel PXc. The first transistor Qa and the second transistor Qb of the second and third pixels PXb and PXc overlapping the first light blocking pattern CP1 may be generally arranged in the first direction x.

The second light blocking pattern CP2 is connected with the first color filter 230a and may protrude in the first direction x from the first color filter 230a toward the second pixel PXb. Therefore, the second light blocking pattern CP2 may be integrated with and formed in one piece with the first color filter 230a. The second light blocking pattern CP2 may overlap the first transistor Qa of the second pixel PXb that neighbors the first pixel PXa.

The third light blocking pattern CP3 is connected with the first color filter 230a, and may protrude from the first color filter 230a in a direction that is opposite to the first direction x toward the third pixel PXc. Therefore, the third light blocking pattern CP3 may be integrated with and formed in one piece with the first color filter 230a. The third blocking pattern CP3 may overlap the second transistor Qb of the third pixel PXc that neighbors the first pixel PXa.

Neighboring first, second, and third pixels PXa, PXb, and PXc may have only one first light blocking pattern CP1 as an island type light blocking pattern which is separated from the first color filter 230a. As such, when the light blocking patterns CP1, CP2, and CP3 are formed, not only can the size of the light blocking patterns CP1, CP2, and CP3 be increased, but also the light blocking patterns CP2 and CP3 are connected with the first color filter 230a. Therefore, the light blocking patterns CP1, CP2, and CP3 can be formed more easily, and peeling can be suppressed.

Similar to the embodiment of FIG. 3, the extension portion 195b1 of the second bridge 195b of the second pixel PXb may extend to pass between the first light blocking pattern CP1 and the second light blocking pattern CP2 that neighbor each other in the second pixel PXb, and the extension portion 195b1 of the third pixel PXc may extend to pass between the first light blocking pattern CP1 and the third light blocking pattern CP3 in the third pixel PXc. Thus, the first and second bridges 195a and 195b (particularly, the extension portion 195b1 of the second bridge 195b) of each of the second and third pixels PXb and PXc may be disposed without overlapping or crossing any of the first, second, and third light blocking patterns CP1, CP2, and CP3.

FIG. 8 is different from the above-described embodiments in the shape and alignment of a second transistor Qb, a gate line 121, and the like.

Referring to FIG. 8, an expansion portion 177b of a second drain electrode 175b is disposed to be closer to a second subpixel electrode 191b than a second transistor Qb in the second and third pixels PXb and PXc. That is, the expansion portion 177b may protrude from the second transistor Qb toward the second subpixel electrode 191b. Accordingly, the transistors Qa and Qb of the second and third pixels PXb and PXc may be disposed in a zigzag form in the first direction x. A gate line 121 may also extend in a zigzag form in the first direction x to overlap the transistors Qa and Qb of the second and third pixels PXb and PXc.

The light blocking pattern CP may be continuously disposed over neighboring second pixels PXb and third pixels PXc. The light shielding pattern CP is connected between neighboring first color filters 230a and is integrated with and formed in one piece with the neighboring first color filters 230a. The light blocking pattern CP may overlap the first and second transistors Qa and Qb of the second and third pixels PXb and PXc, and may extend in the zigzag form in the first direction x. The light blocking pattern CP may include a portion extending in the first direction x and a portion extending in the diagonal direction with respect to the first direction x. Unlike as shown in the drawing, the light blocking pattern CP may include only a portion extending in an approximately oblique direction.

Transistors Qa and Qb are disposed in a zigzag form in the first direction x and the light blocking patterns CP are formed accordingly, and thus the subpixel electrodes 191a and 191b can be connected with the expansion portions 177a and 177b of the first and second drain electrodes 175a and 175b respectively through the first and second bridges 195a and 195b without increasing spacing between the first subpixel electrode 191a and the second subpixel electrode 191b. Because a protruding direction of the expansion portion 177a and a protruding direction of the expansion portion 177b are opposite to each other, the space between the first subpixel electrode 191a and the second subpixel electrode 191b may be increased when the transistors Qa and Qb are disposed in parallel with each other in the first direction x. In this case, the aperture ratio of the display device is not only reduced but also it may be disadvantageous for high resolution.

In such a structure, the expansion portion 177b of the second drain electrode 175b is disposed between the light blocking pattern CP and the second subpixel electrode 191b. Therefore, the second bridge 195b for connecting the second subpixel electrode 191b to the expansion portion 177b may be disposed so as not to cross or overlap the light blocking pattern CP, and the design freedom of the second bridge 195b may be increased. Similarly, because the expansion portion 177a of the first drain electrode 175a is disposed between the light blocking pattern CP and the first subpixel electrode 191a, the first bridge 195a for connecting the first subpixel electrode 191a to the expansion portion 177a may be disposed so as not to cross or overlap the light blocking pattern CP.

Although one light blocking pattern CP is continuously formed in the second and third pixels PXb and PXc in the embodiment shown in the drawing, a plurality of light blocking patterns that are separated or disposed apart from each other may be included as in the embodiments of FIG. 3, FIG. 6, and/or FIG. 7.

Figure 9:
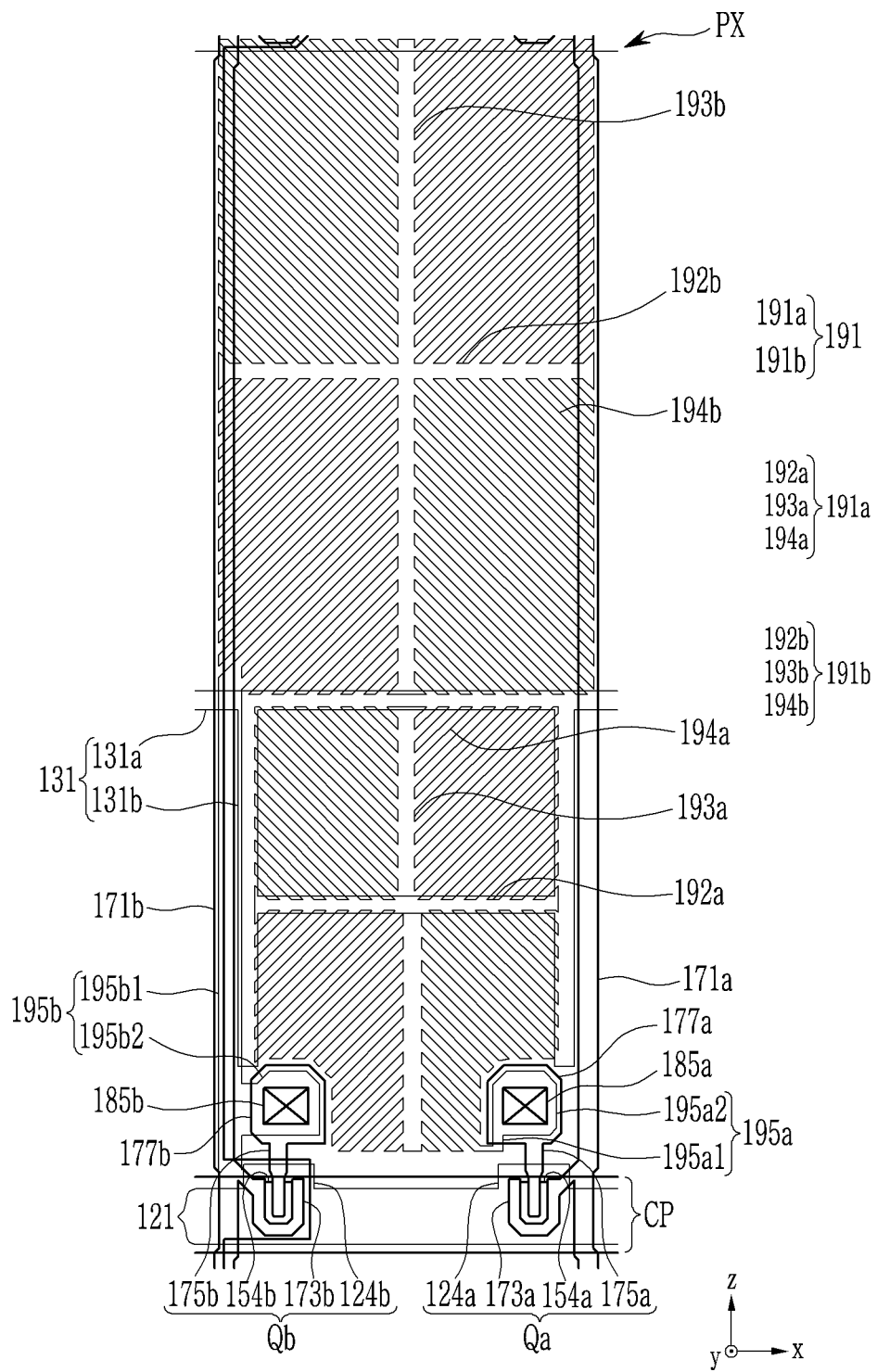
FIG. 9 is a plan view of a pixel in a display device according to an embodiment.

FIG. 9 is a planar layout view of a pixel in a display device according to an embodiment.

Referring to FIG. 9, unlike the embodiment described above, an embodiment in which both of the first subpixel electrode 191a and the second subpixel electrode 191b are disposed on one side of the gate line 121. The illustrated pixel PX may be a second pixel PXb or a third pixel PXc among three neighboring pixels PXa, PXb, and PXc.

The pixel electrode 191 may include a first subpixel electrode 191a and a second subpixel electrode 191b that are physically separated from each other. The first subpixel electrode 191a may be connected with an expansion portion 177a of a first drain electrode 175a of a first transistor Qa through a first bridge 195a, and a second subpixel electrode 191b may be connected with an expansion portion 177b of a second drain electrode 175b of a second transistor Qb through a second bridge 195b. Accordingly, the first subpixel electrode 191a may receive a data voltage transmitted through the first data line 171a, and the second subpixel electrode 191b may receive a data voltage transmitted through the second data line 171b. The first subpixel electrode 191a and the second subpixel electrode 191b may receive different data voltages based on the same video signal, and accordingly, luminance of a region overlapping the first subpixel electrode 191a and luminance of a region overlapping the second subpixel electrode 191b may be different from each other, thus side visibility can be improved.

An example in which the first subpixel electrode 191a is located closer to the gate line 121 than the second subpixel electrode 191b is illustrated, but vice versa is also possible.

A light blocking pattern CP that can be formed together with a first color filter 230a may overlap the first and second transistors Qa and Qb, and the light blocking pattern CP absorbs light incident on the first and second transistors Qa and Qb to prevent light from reaching channels of the first and second transistors Qa and Qb. The light blocking patterns CP may be variously formed and disposed as shown in the embodiments of FIG. 3, FIG. 6, FIG. 7, and/or FIG. 8.

In the illustrated structure, the expansion portion 177a of the first drain electrode 175a and the expansion portion 177b of the second drain electrode 175b are both disposed between the light blocking patterns CP and the pixel electrode 191. Thus, the first bridge 195a for connecting the first subpixel electrode 191a to the expansion portion 177a and the second bridge 195b for connecting the second subpixel electrode 191b to the expansion portion 177b may be disposed not to cross or overlap with the light blocking pattern CP, and the design freedom of the first and second bridges 195a and 195b can be increased.

Figure 10:
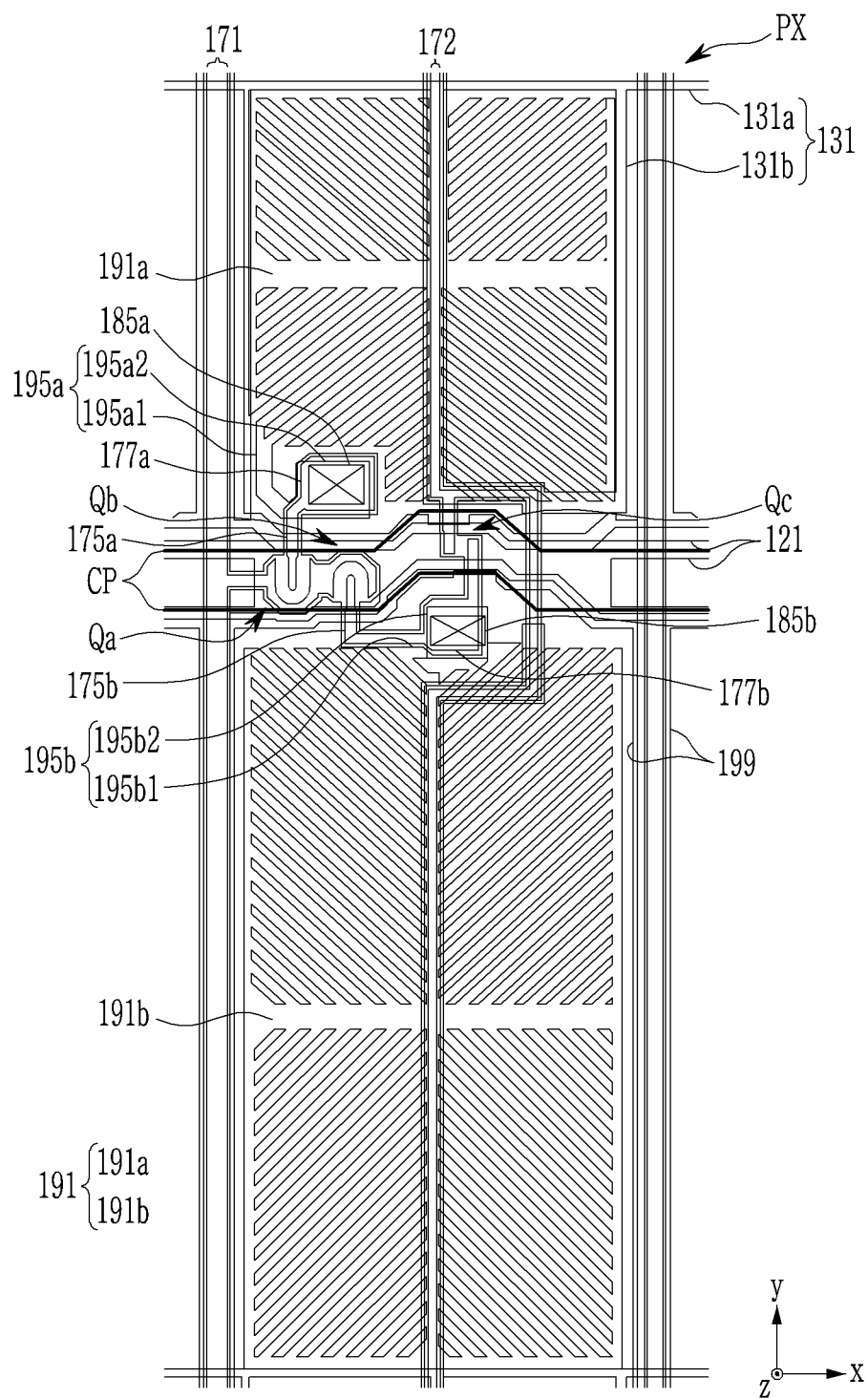
FIG. 10 is a plan of a pixel in a display device according to an embodiment.

FIG. 10 is a planar layout view of a pixel in a display device according to an embodiment.

The embodiment shown in FIG. 10 is different from the above-described embodiments in a pixel structure for improving side visibility. The illustrated pixel PX may be a second pixel PXb or a third pixel PXc among three neighboring pixels PXa, PXb, and PXc.

Referring to FIG. 10, a pixel electrode 191 of the pixel PX includes a first subpixel electrode 191a and a second subpixel electrode 191b that are physically separated from each other. The first subpixel electrode 191a is connected with a data line 171 and a gate line 121 through a first transistor Qa, and the second subpixel electrode 191b is connected with the data line 171 and the gate line 121 through a second transistor Qb. The second subpixel electrode 191b is also connected with a reference voltage line 172 and the gate line 121 through a third transistor Qc. The reference voltage line 172 may transmit a reference voltage which may be higher than a common voltage.

In such a pixel structure, the first, second, and third transistors Qa, Qb, and Qc are simultaneously turned on by a gate on voltage applied through the gate line 121, and thus the first subpixel electrode 191a and the second subpixel electrode 191b may receive the same data voltage through the data line 171. Thus, a first liquid crystal capacitor including the first subpixel electrode 191a and a second liquid crystal capacitor including the second subpixel electrode 191b may be charged with the same data voltage. In this case, a charging voltage of the second liquid crystal capacitor is divided by the third transistor Qc, and thus may be smaller than a charging voltage of the first liquid crystal capacitor. Accordingly, luminance of a region overlapping the first subpixel electrode 191a and luminance of a region overlapping the second subpixel electrode 191b in one pixel PX may be different from each other, and thus an image viewed from the side can be as similar as possible to the image viewed from the front, thereby improving side visibility.

Light blocking patterns CP, which may be disposed in the second and third pixels PXb and PXc, may overlap the first, second, and third transistor Qa, Qb, and Qc. The light blocking patterns CP absorb light incident on the first, second, and third transistors Qa, Qb, and Qc, and thus light can be prevented from reaching channels of the first, second, and third transistors Qa, Qb, and Qc. The light blocking pattern CP may be variously formed and disposed so as to overlap at least one of the transistors Qa, Qb, and Qc as shown in the above-described embodiments of FIG. 3, FIG. 6, FIG. 7, and/or FIG. 8.

In the illustrated structure, the expansion portion 177a of the first drain electrode 175a of the first transistor Qa is disposed between the first subpixel electrode 191a and the light blocking pattern CP, and the expansion portion 177b of the second drain electrode 175b of the second transistor Qb is disposed between the second subpixel electrode 191b and the light blocking pattern CP. Thus, a first bridge 195a for connecting the first subpixel electrode 191a to the expansion portion 177a may be disposed so as not to cross or be overlapped with the light blocking pattern CP, and a second bridge 195b for connecting the second subpixel electrode 191b to the expansion portion 177b may be disposed so as not to cross or be overlapped with the light blocking pattern CP.

While inventive concept has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A display device comprising:
a substrate; and
a plurality of pixels, the plurality of pixels including a first pixel having a first color filter, a second pixel having a second color filter and a third pixel having a third color filter, each of the plurality of pixels including:
a gate line that is disposed on the substrate, and extends in a first direction,
a first transistor and a second transistor that are connected with the gate line,
a pixel electrode that includes a first subpixel electrode and a second subpixel electrode that are separated from each other,
a first bridge that connects the first subpixel electrode and the first transistor, and
a second bridge that connects the second subpixel electrode and the second transistor,
wherein at least one of the second pixel and the third pixel includes a light blocking pattern that overlaps at least one of the first transistor and the second transistor,
the first bridge and the second bridge do not overlap the light blocking pattern in a plan view,
the first bridge comprises a first extension portion protruding from the first subpixel electrode and a first contact portion having a wider width than the first extension portion,
the second bridge includes a second extension portion protruding from the second subpixel electrode and a second contact portion having a wider width than the second extension portion,
the light blocking pattern comprises a first light blocking pattern overlapping the first transistor and a second light blocking pattern overlapping the second transistor, and
one of the first extension portion and the second extension portion extends between the first light blocking pattern and the second light blocking pattern in a second direction that crosses the first direction.

2. The display device of claim 1, wherein the light blocking pattern is formed of the first color filter and disposed between the substrate and the second color filter or the third color filter.

3. The display device of claim 2, wherein the light blocking pattern is connected with the first color filter.

4. A display device comprising:
a substrate; and
a plurality of pixels, the plurality of pixels including a first pixel having a first color filter, a second pixel having a second color filter and a third pixel having a third color filter, each of the plurality of pixels including:

a gate line that is disposed on the substrate, and extends in a first direction, a first transistor and a second transistor that are connected with the gate line, a pixel electrode that includes a first subpixel electrode and a second subpixel electrode that are separated from each other, a first bridge that connects the first subpixel electrode and the first transistor, and a second bridge that connects the second subpixel electrode and the second transistor, wherein at least one of the second pixel and the third pixel includes a light blocking pattern that overlaps at least one of the first transistor and the second transistor, the first bridge and the second bridge do not overlap the light blocking pattern in a plan view, the first bridge comprises a first extension portion protruding from the first subpixel electrode and a first contact portion having a wider width than the first extension portion, the second bridge includes a second extension portion protruding from the second subpixel electrode and a second contact portion having a wider width than the second extension portion, the light blocking pattern is formed in one piece and overlaps both of the first transistor and the second transistor, and one of the first extension portion and the second extension portion is disposed between one side of the light blocking pattern and a data line disposed adjacent to the light blocking pattern, and extends in a second direction that crosses the first direction.

5. The display device of claim 4, wherein each of the first subpixel electrode and the second subpixel electrode is substantially quadrilateral.

6. The display device of claim 4, further comprising a first insulating layer that is disposed on the first transistor and the second transistor, wherein the light blocking pattern is disposed between the first insulating layer and the second color filter or the third color filter.

7. The display device of claim 6, further comprising a second insulating layer that is disposed on the first color filter, the second color filter, and the third color filter, wherein the first bridge is connected with the first transistor through an opening formed through the first insulating layer and the second insulating layer, and the second bridge is connected with the second transistor through an opening formed through the first insulating layer and the second insulating layer.

8. The display device of claim 4, wherein the light blocking pattern represents a same color as the first color filter.

9. The display device of claim 4, wherein the gate line is disposed between the first subpixel electrode and the second subpixel electrode.

10. A display device comprising:

a plurality of pixels, the plurality of pixels including a first pixel, a second pixel and a third pixel, each of the plurality of pixels including:

a gate line that in operation transmits a gate signal, a first transistor and a second transistor that are connected with the gate line, a first insulating layer that is disposed on the first transistor and the second transistor, a color filter, a pixel electrode that is disposed on the color filter, and includes a first subpixel electrode and a second subpixel electrode, a first bridge that connects the first subpixel electrode with the first transistor, and a second bridge that connects the second subpixel electrode and the second transistor, and a light blocking pattern that is disposed between the first insulating layer and the color filter in at least one of the second pixel and the third pixel not to overlap the first bridge and the second bridge in a plan view, wherein the first bridge comprises a first extension portion protruding from the first subpixel electrode and a first contact portion having a wider width than the first extension portion, the second bridge includes a second extension portion protruding from the second subpixel electrode and a second contact portion having a wider width than the second extension portion, the light blocking pattern is selected from a group consisting of a one-piece light blocking patter and a two-piece light blocking member, and if the light blocking pattern is the single-piece light blocking member, the light blocking pattern overlaps both of the first transistor and the second transistor, and one of the first extension portion and the second extension portion is disposed between one side of the light blocking pattern and a data line disposed adjacent to the light blocking pattern, and extends in a second direction that crosses the first direction, and if the light blocking pattern is the two-piece light blocking pattern, the light blocking pattern comprises a first light blocking pattern overlapping the first transistor and a second light blocking pattern overlapping the second transistor, and one of the first extension portion and the second extension portion extends between the first light blocking pattern and the second light blocking pattern in a second direction that crosses the first direction.

11. The display device of claim 10, wherein the first bridge comprises a first extension portion connected with the first subpixel electrode and a first contact portion connected with the first extension portion, and the second bridge comprises a second extension portion connected with the second subpixel electrode and a second contact portion connected with the second extension portion.

12. The display device of claim 11, further comprising a second insulating layer that is disposed between the color filter and the pixel electrode, wherein the first subpixel electrode, the second subpixel electrode, the first extension portion, and the second extension portion are disposed on the second insulating layer, and the first bridge and the second bridge are respectively connected with the first transistor and the second transistor through an opening formed through the first insulating layer and the second insulating layer.

13. The display device of claim 11, wherein the color filter comprising a first color filter disposed in the first pixel, a second color filter disposed in the second pixel, and a third color filter disposed in the third pixel that respectively represent different colors, and wherein the light blocking pattern represents a same color as the first color filter.

14. The display device of claim 13, wherein the light blocking pattern is connected with the first color filter.

15. The display device of claim 14, wherein the light blocking pattern overlaps the second color filter and the third color filter.

* * * * *